US012635534B2

(12) United States Patent
Osaki et al.

(10) Patent No.: US 12,635,534 B2
(45) Date of Patent: May 19, 2026

(54) SEMICONDUCTOR DEVICE AND SEMICONDUCTOR DEVICE MANUFACTURING METHOD

(71) Applicant: FUJI ELECTRIC CO., LTD., Kawasaki (JP)

(72) Inventors: Koji Osaki, Matsumoto-city (JP); Yuichiro Hinata, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 392 days.

(21) Appl. No.: 18/343,232

(22) Filed: Jun. 28, 2023

(65) Prior Publication Data

US 2024/0071898 A1 Feb. 29, 2024

(30) Foreign Application Priority Data

Aug. 26, 2022 (JP) ................................. 2022-134977

(51) Int. Cl.
*H01L 23/498* (2006.01)
*H01L 23/00* (2006.01)
(Continued)

(52) U.S. Cl.
CPC ...... *H10W 70/479* (2026.01); *H10D 62/8325* (2025.01); *H10W 70/041* (2026.01); (Continued)

(58) Field of Classification Search
CPC ......... H01L 23/49861; H01L 23/49844; H01L 21/4825; H01L 24/32; H01L 24/48; (Continued)

(56) References Cited

U.S. PATENT DOCUMENTS 5,277,972 A 1/1994 Sakumoto et al.
2009/0189264 A1 7/2009 Yato et al.
(Continued)

FOREIGN PATENT DOCUMENTS

JP H02222477 A 9/1990
JP 2009206482 A 9/2009
(Continued)

OTHER PUBLICATIONS

Machine English Translation of JP 2017143185, Semiconductor Device and Manufacturing Method of the Same, Wakagi et al., publishe Aug. 17, 2017.*

*Primary Examiner* — Peniel M Gumedzoe
(74) *Attorney, Agent, or Firm* — Rabin & Berdo, P.C.

(57) ABSTRACT

A semiconductor device includes a semiconductor chip having a main electrode on a front surface thereof, a wiring board having a front surface to which a rear surface of the semiconductor chip is bonded, a sealing member sealing the wiring board and the semiconductor chip, and an adhesive layer including at least two adhesive films that are laminated to each other. The adhesive layer is provided on surfaces of the wiring board and the semiconductor chip so that the sealing member seals the wiring board and the semiconductor chip via the adhesive layer. As a result, the sealing member is able to reliably seal the semiconductor chip and wiring board via the adhesive layer, thereby preventing an occurrence and extension of separation.

12 Claims, 9 Drawing Sheets

(51) Int. Cl.

| | |
|---|---|
| *H01L 25/18* | (2023.01) |
| *H01L 29/16* | (2006.01) |
| *H10D 62/832* | (2025.01) |
| *H10W 70/04* | (2026.01) |
| *H10W 70/40* | (2026.01) |
| *H10W 70/65* | (2026.01) |
| *H10W 90/00* | (2026.01) |
| *H10W 72/00* | (2026.01) |
| *H10W 72/50* | (2026.01) |

(52) U.S. Cl.

CPC ......... *H10W 70/658* (2026.01); *H10W 90/00* (2026.01); *H10W 72/07331* (2026.01); *H10W 72/07332* (2026.01); *H10W 72/5438* (2026.01); *H10W 72/884* (2026.01); *H10W 90/734* (2026.01)

(58) Field of Classification Search

CPC ......... H01L 24/73; H01L 24/83; H01L 25/18; H01L 2224/32225; H01L 2224/4846; H01L 2224/73265; H01L 2224/83201; H01L 2224/83885; H01L 2924/13055; H01L 2924/13091; H10D 62/8325

See application file for complete search history.

(56) References Cited

U.S. PATENT DOCUMENTS

| | | | |
|---|---|---|---|
| 2011/0192630 A1 | | 8/2011 | Ishino et al. |
| 2019/0035770 A1* | | 1/2019 | Iguchi ................. H01L 23/3121 |
| 2021/0296190 A1 | | 9/2021 | Nakamata |
| 2021/0305175 A1 | | 9/2021 | Abe et al. |

FOREIGN PATENT DOCUMENTS

| | | | |
|---|---|---|---|
| JP | 2011165871 A | | 8/2011 |
| JP | 2015109292 A | | 6/2015 |
| JP | 2015198147 A | | 11/2015 |
| JP | 2021150458 A | | 9/2021 |
| JP | 2021150466 A | | 9/2021 |
| WO | 2020017574 A1 | | 1/2020 |

* cited by examiner

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2022-134977, filed on Aug. 26, 2022, the entire contents of which are incorporated herein by reference.

BACKGROUND OF THE INVENTION

1. Field of the Invention

The embodiment discussed herein relates to a semiconductor device and a semiconductor device manufacturing method.

2. Background of the Related Art

Semiconductor devices include power devices and, for example, form inverters. The power devices are insulated gate bipolar transistors (IGBTs) and power metal-oxide-semiconductor field-effect transistors (MOSFETs), for example. A semiconductor device includes semiconductor chips including power devices, an insulated circuit substrate on which the semiconductor chips are bonded using a bonding material, and a heat dissipation base on which the insulated circuit substrate is disposed, and these are sealed by a sealing member.

However, some contact areas of the sealing member with the semiconductor chips, bonding material, insulated circuit substrate, and heat dissipation base may have low adhesion. To deal with this, a primer layer (adhesive layer) is applied to the laminated semiconductor chips, bonding material, insulated circuit substrate, and heat dissipation base, and then the sealing member is applied over the primer layer. By doing so, it is possible to prevent separation of the sealing member (see, for example, Japanese Laid-open Patent Publication No. 2021-150466, Japanese Laid-open Patent Publication No. 2021-150458, Japanese Laid-open Patent Publication No. 2009-206482, International Publication Pamphlet No. WO 2020/017574, and Japanese Laid-open Patent Publication No. 2011-165871).

In addition, a protective layer may be formed around an electrode layer in order to protect pressure-resistance structure. For example, this protective layer is made of a polyimide resin. The protective layer is formed using the polyimide resin in two steps so that the protective layer has a rough surface. This further improves the mechanical reliability (see, for example, Japanese Laid-open Patent Publication No. 2015-109292).

In this connection, a lead frame included in a semiconductor device sealed with a sealing member (resin) as described above is provided with an adhesive tape for fixing the lead frame. Such an adhesive tape includes a base film and a heat resistance adhesive layer laminated on the surface of the base film. The base film is controlled so that the linear expansion coefficient and heat-induced dimensional change rate in the width direction each fall within a predetermined range. By doing so, it is possible to prevent misalignment of the lead frame in a heat treatment during the manufacture of the semiconductor device (see, for example, Japanese Laid-open Patent Publication No. H02-222477).

In addition, a protective sheet for the rear surface of a solar battery module is formed by laminating a weather resistance layer, an insulating layer containing a thermoplastic resin, and an encapsulant adhesive layer in order. This protective sheet exhibits weather resistance (see, for example, Japanese Laid-open Patent Publication No. 2015-198147).

To form an adhesive layer that is a primer layer on semiconductor chips and others in order to improve the adhesion of a sealing member, an adhesive forming the adhesive layer is sprayed, so that the adhesive layer is applied. However, for example, the sprayed adhesive adhering to the corners and sides of the semiconductor chips may flow down. For this reason, the adhesive layer is not applied to the corners or sides of the semiconductor chips properly, which still results in low adhesion to the sealing member. Thus, the sealing member may separate from the semiconductor chips and others, starting at a location with such low adhesion.

SUMMARY OF THE INVENTION

According to one aspect, there is provided a semiconductor device, including: a semiconductor chip having a main electrode on a front surface thereof; a wiring board having a front surface to which a rear surface of the semiconductor chip is bonded; a sealing member sealing the wiring board and the semiconductor chip; and an adhesive layer including at least two adhesive films that are laminated to each other, the adhesive layer being provided on surfaces of the wiring board and the semiconductor chip so that the sealing member seals the wiring board and the semiconductor chip via the adhesive layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. In the following description, the terms "front surface" and "upper surface" refer to an X-Y surface facing up (in the +Z direction) in a semiconductor device 10 of drawings. Similarly, the term "up" refers to an upward direction (the +Z direction) in the semiconductor device 10 of the drawings. The terms "rear surface" and "lower surface" refer to an X-Y surface facing down (in the −Z direction) in the semiconductor device 10 of the drawings. Similarly, the term "down" refers to a downward direction (the −Z direction) in the semiconductor device 10 of the drawings. The same directionality applies to other drawings, as appropriate. The terms "front surface," "upper surface," "up," "rear surface," "lower surface," "down," and "side surface" are used for convenience to describe relative positional relationships, and do not limit the technical ideas of the embodiment. For example, the terms "up" and "down" are not always related to the vertical directions to the ground. That is, the "up" and "down" directions are not limited to the gravity direction. In addition, in the following description, the term "main component" refers to a component contained at a volume ratio of 80 vol % or more. The expression "being approximately equal" may allow an error range of ±10%. In addition, the expressions "being perpendicular" and "being parallel" may allow an error range of ±10°.

Figure 1:
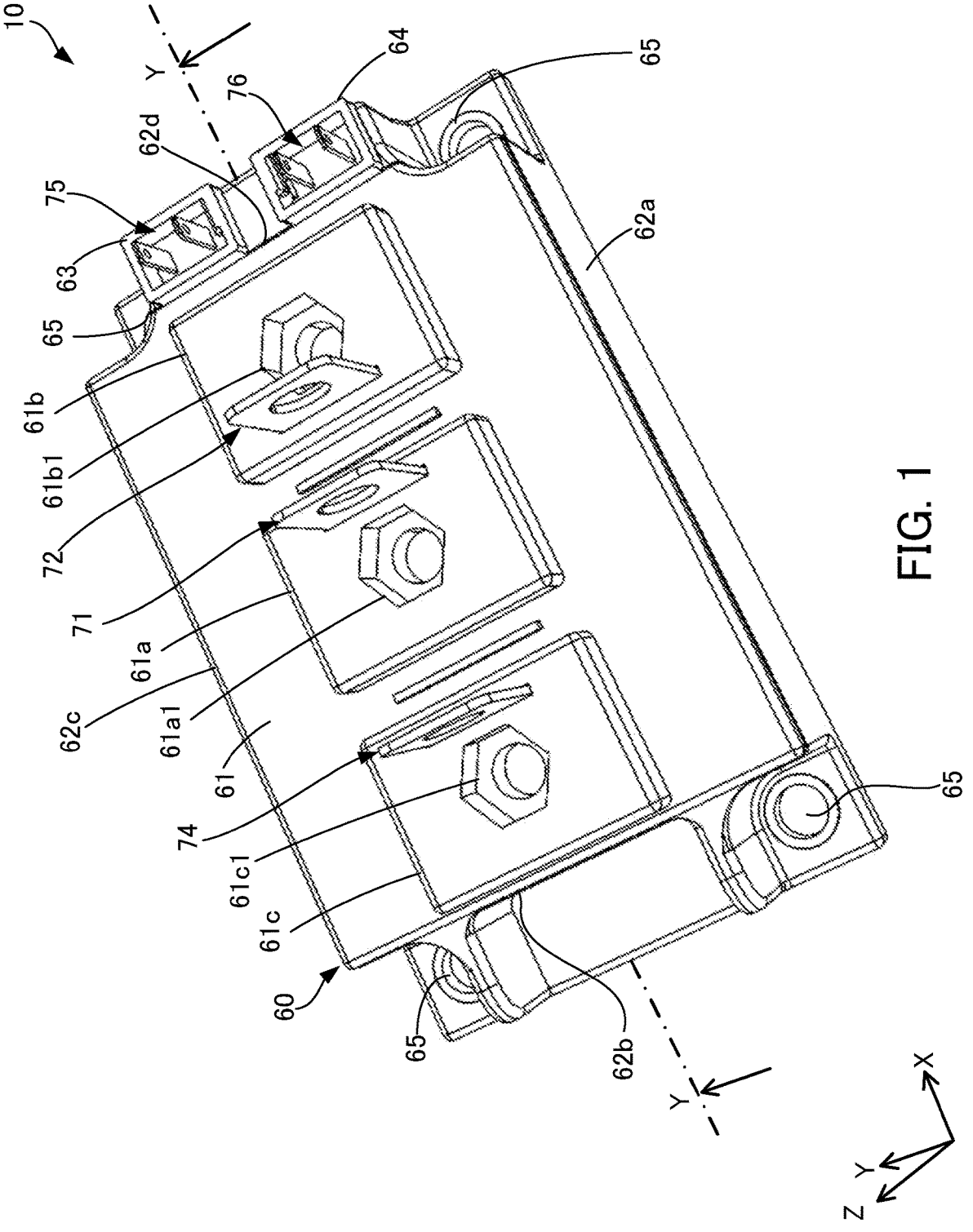
FIG. 1 is an appearance view of a semiconductor device according to one embodiment.
Figure 2:
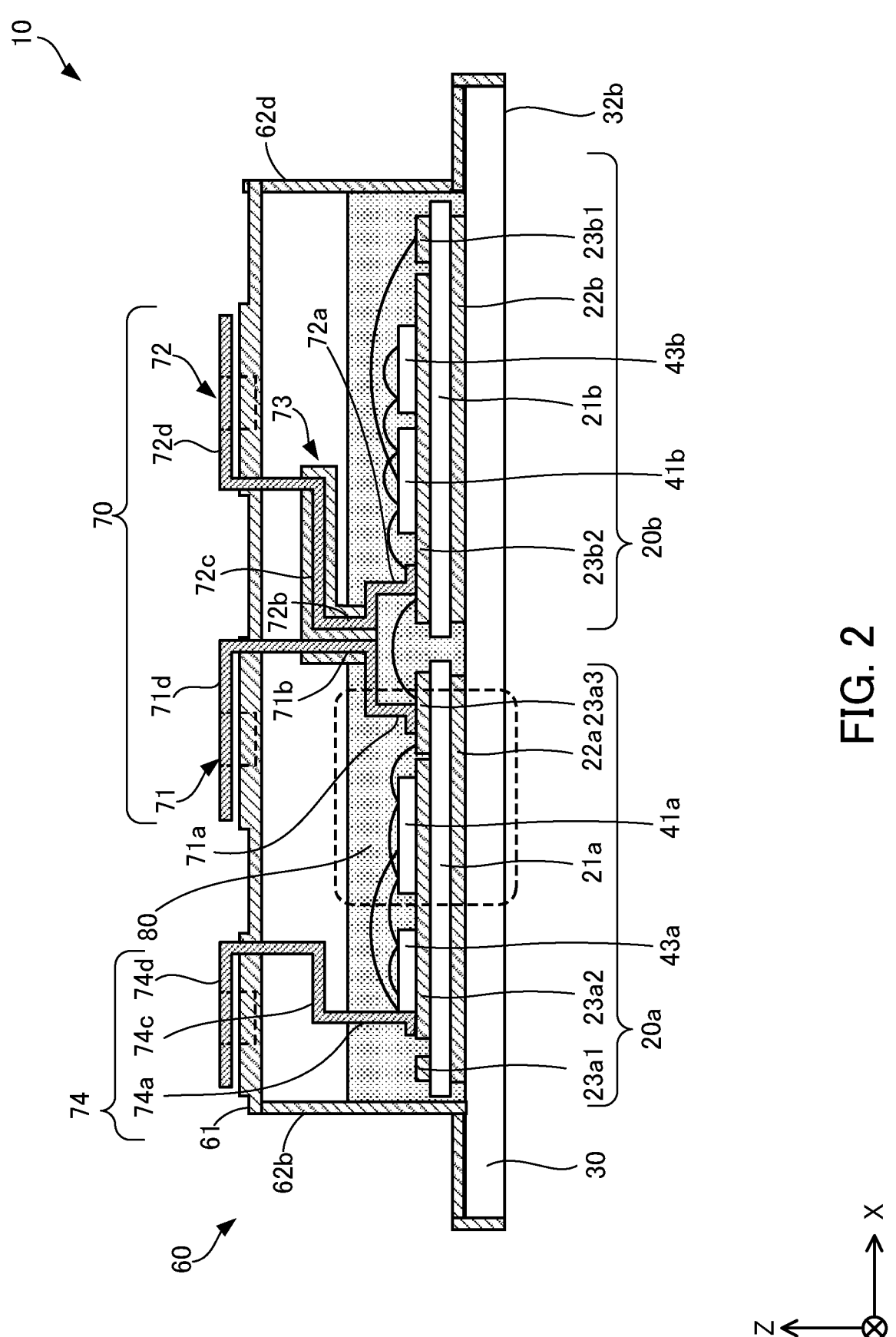
FIG. 2 is a sectional view of the semiconductor device according to the embodiment.

A semiconductor device 10 will be described with reference to FIG. 1. FIG. 1 is an appearance view of a semiconductor device according to one embodiment. Components, which will be described later, of the semiconductor device 10 are housed in a case 60, as illustrated in FIG. 2. In this connection, a heat dissipation base 30 that is rectangular in plan view is provided at the rear surface (on the rear surface side of the case 60) of the semiconductor device 10.

The case 60 includes a lid 61, sidewalls 62a to 62d, and terminal ports 63 and 64. The lid 61 also has terminal blocks 61a, 61b, and 61c arranged at the center thereof in the long-side direction. Screw holes 61a1, 61b1, and 61c1 are respectively formed in the front surfaces of the terminal blocks 61a, 61b, and 61c. First to third wiring members 71, 72, and 74 extend upward from the terminal blocks 61a, 61b, and 61c, respectively. FIG. 1 illustrates the case where the first to third wiring members 71, 72, and 74 extend upward (in the +Z direction). The extending first to third wiring members 71, 72, and 74 are bent toward the front surfaces of the terminal blocks 61a, 61b, and 61c, respectively, so that openings formed in the first to third wiring members 71, 72, and 74 face the screw holes 61a1, 61b1, and 61c1, respectively (see FIG. 2). External terminals are respectively provided at the first to third wiring members 71, 72, and 74 bent in this way, and screws are respectively inserted into the openings of the first to third wiring members 71, 72, and 74 and fastened into the screw holes 61a1, 61b1, and 61c1 together with the external terminals. In addition, the case 60 has fixing holes 65 at the four corners thereof in plan view. The case 60 surrounds fastening holes 31a to 31d (see FIG. 3), and each fixing hole 65 and the corresponding fastening hole 31a to 31d are aligned.

The sidewalls 62a to 62d surround in order the four sides of the heat dissipation base 30. The sidewalls 62a to 62d surround the components disposed on the heat dissipation base 30 (see FIGS. 3 and 4). In plan view, the sidewalls 62a and 62c correspond to the long side of the case 60, and the sidewalls 62b and 62d correspond to the short side of the case 60. In this connection, the sidewalls 62a to 62d are firmly attached to the heat dissipation base 30 using an adhesive. The terminal ports 63 and 64 are provided in the sidewall 62d. Control terminals 75 and 76 are exposed from the terminal ports 63 and 64. In this connection, the fixing holes 65 are formed in the vicinity of the corners each defined by two of the sidewalls 62a to 62d. By inserting screws into the fixing holes 65, the semiconductor device 10 is attached to a cooling surface of a cooling unit, not illustrated.

The sidewalls 62a to 62d, terminal ports 63 and 64, and fixing holes 65 included in the case 60 are integrally formed of a resin. In addition, the lid 61 is also integrally formed of the resin. The resin here contains a thermoplastic resin as a main component. Examples of the thermoplastic resin include a polyphenylene sulfide resin, a polybutylene terephthalate resin, a polybutylene succinate resin, a polyamide resin, and an acrylonitrile butadiene styrene resin. The case 60 may be formed by attaching the lid 61, which is separately formed, to the opening formed by the sidewalls 62a to 62d using an adhesive.

Figure 3:
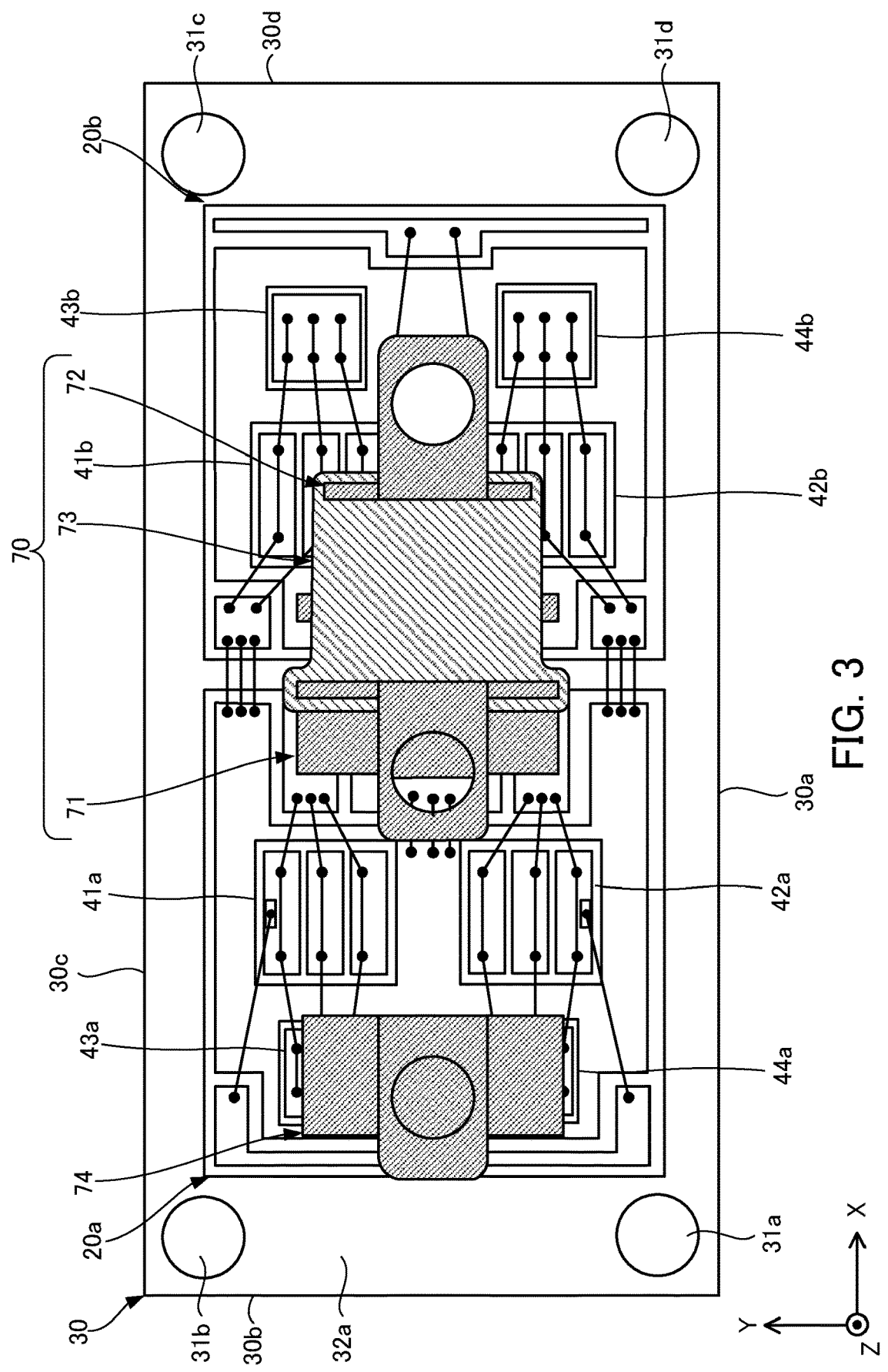
FIG. 3 is a plan view (without a case) of the semiconductor device according to the embodiment.
Figure 4:
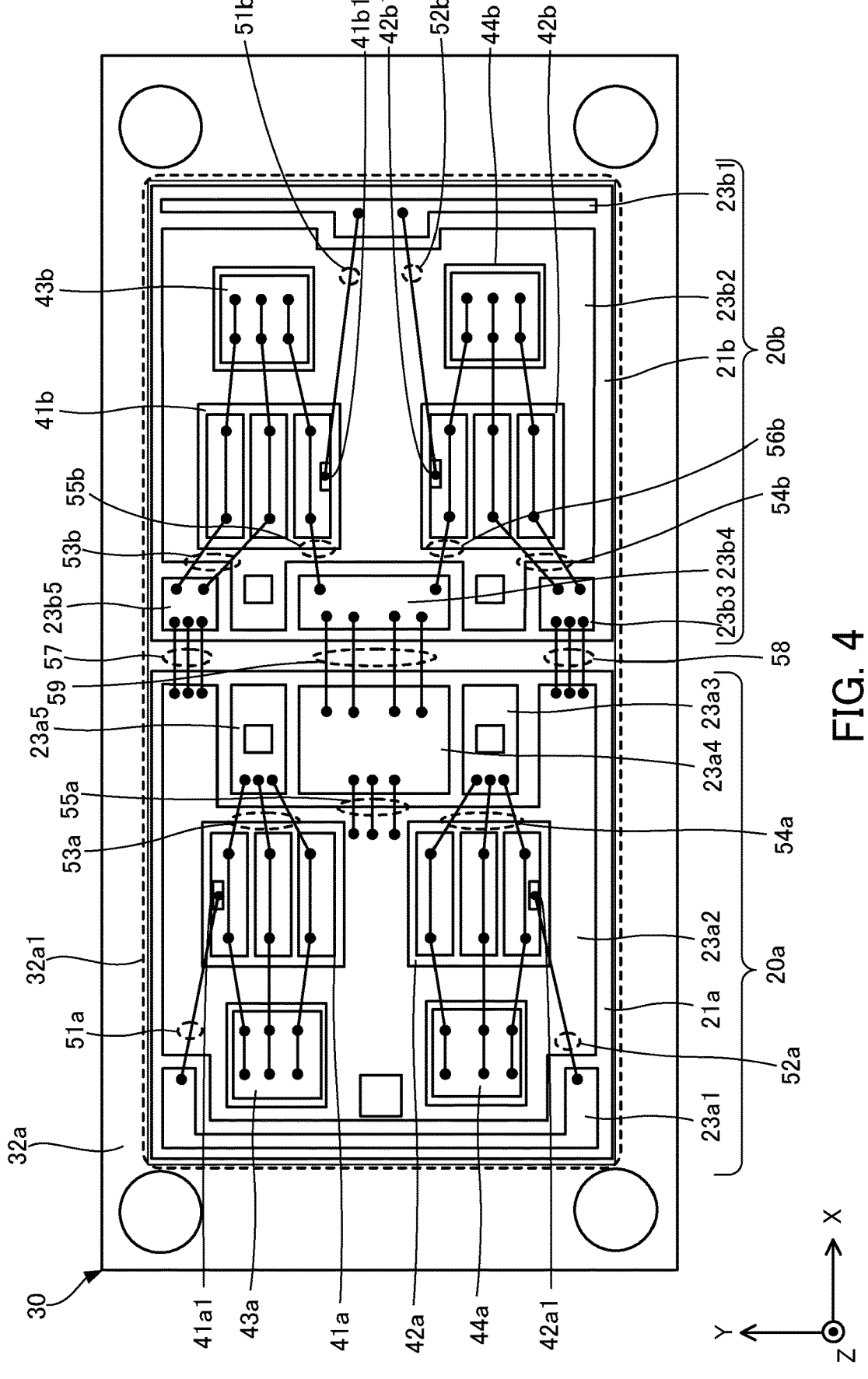
FIG. 4 is a plan view (without a case or terminals) of the semiconductor device according to the embodiment.

The following describes the components housed in the semiconductor device 10 with reference to FIGS. 2 to 4. FIG. 2 is a sectional view of the semiconductor device according to the embodiment. FIG. 3 is a plan view (without a case) of the semiconductor device according to the embodiment. FIG. 4 is a plan view (without a case or terminals) of the semiconductor device according to the embodiment. In this connection, FIG. 2 is a sectional view taken along a dash-dotted line Y-Y of FIG. 1. FIG. 3 is a plan view of the semiconductor device 10 of FIG. 1 without the case 60. FIG. 4 is a plan view of the semiconductor device 10 of FIG. 1 without the case 60 or the first to third wiring members 71, 72, and 74.

As illustrated in FIGS. 2 to 4, the semiconductor device 10 includes insulated circuit substrates 20a and 20b and the heat dissipation base 30 having the insulated circuit substrates 20a and 20b disposed on the front surface thereof. In the semiconductor device 10, these components are housed in the case 60. Semiconductor chips 41a to 44a and 41b to 44b are disposed on the insulated circuit substrates 20a and 20b. In addition, the semiconductor device 10 includes the first to third wiring members 71, 72, and 74. For example, the first to third wiring members 71, 72, and 74 are plate-like lead frames.

The case 60 is provided on the periphery of the heat dissipation base 30. This case 60 has the sidewalls 62a to 62d that surround the insulated circuit substrates 20a and 20b, and the lid 61 provided at the top of the opening formed by the sidewalls 62a to 62d. The semiconductor chips 41a to 44a and 41b to 44b, insulated circuit substrates 20a and 20b (and bonding wires 51a to 55a, 51b to 56b, and 57 to 59) are housed in the space surrounded by the case 60 and heat dissipation base 30. In addition, the semiconductor chips 41a to 44a and 41b to 44b, insulated circuit substrates 20a and 20b (and bonding wires 51a to 55a, 51b to 56b, and 57 to 59) may be sealed by a sealing member 80. The sealing member 80 contains as a main component a material with high insulation and adhesion, a low elastic modulus, and a high heat and cold resistance. Such a material may be a thermosetting resin. Examples of the thermosetting resin include an epoxy resin, a phenolic resin, a maleimide resin, and a polyester resin. Among these, the sealing member 80 is preferably made of an epoxy resin. In addition, a filler may be added to the sealing member. The filler is a ceramic material with insulation and high thermal conductivity. In this connection, the sealing member 80 seals the inside of the case 60 via an adhesive layer. The adhesive layer will be described in detail later.

End portions of the first to third wiring members 71, 72, and 74 for electrical connection with an external device are exposed on the lid 61. In this connection, the illustration of the control terminals 75 and 76 illustrated in FIG. 1 is omitted in FIGS. 2 to 4.

The inner end portion of each of the first to third wiring members 71, 72, and 74 is connected to the insulated circuit substrate 20*a* or the insulated circuit substrate 20*b* inside the case 60. In addition, the other outer end portion thereof extends to the outside from the lid 61. The external end portion may be connected to a power supply or load, not illustrated.

More specifically, the inner end portion of the first wiring member 71 is electrically and mechanically connected to the wiring boards 23*a*3 and 23*a*5 of the insulated circuit substrate 20*a*. The inner end portion of the first wiring member 71 is electrically connected to the semiconductor chips 41*a*, 42*a*, 43*a*, and 44*a* via the wiring boards 23*a*3 and 23*a*5 and the bonding wires 53*a* and 54*a*. The outer end portion (first external connection portion 71*d*) of the first wiring member 71 extends to the outside from the lid 61 and is bent toward the front surface of the lid 61.

The inner end portion of the second wiring member 72 is electrically and mechanically connected to the wiring board 23*b*2 of the insulated circuit substrate 20*b*. The inner end portion of the second wiring member 72 is electrically connected to the semiconductor chips 41*b*, 42*b*, 43*b*, and 44*b* via the wiring board 23*b*2. The outer end portion (second external connection portion 72*d*) of the second wiring member 72 extends to the outside from the lid 61 and is bent toward the front surface of the lid 61.

The inner end portion of the third wiring member 74 is electrically and mechanically connected to the wiring board 23*a*2 of the insulated circuit substrate 20*a*. The inner end portion of the third wiring member 74 is electrically connected to the semiconductor chips 41*a*, 42*a*, 43*a*, and 44*a* via the wiring board 23*a*2. The outer end portion (third external connection portion 74*d*) of the third wiring member 74 extends to the outside from the lid 61 and is bent toward the front surface of the lid 61.

In addition, a wiring unit 70 includes the above-described first and second wiring members 71 and 72 and a wiring holding unit 73. In the wiring unit 70, parts of the first and second wiring members 71 and 72 are integrally formed with the wiring holding unit 73. Note that the wiring holding unit 73 enables the first and second wiring members 71 and 72 to keep insulation therebetween.

The insulated circuit substrates 20*a* and 20*b* include insulating plates 21*a* and 21*b*, metal plates 22*a* and 22*b* formed on the rear surfaces of the insulating plates 21*a* and 21*b*, and wiring boards 23*a*1 to 23*a*5 and 23*b*1 to 23*b*5 formed on the front surfaces of the insulating plates 21*a* and 21*b*, respectively. In this connection, the insulating plates 21*a* and 21*b* and metal plates 22*a* and 22*b* are rectangular in plan view. In addition, the corners of the insulating plates 21*a* and 21*b* and metal plates 22*a* and 22*b* may be rounded or chamfered. In plan view, the metal plates 22*a* and 22*b* are smaller in size than the insulating plates 21*a* and 21*b* and are formed inside the insulating plates 21*a* and 21*b*, respectively.

The insulating plates 21*a* and 21*b* are made of a ceramic material with high thermal conductivity as a main component. The ceramic material contains aluminum oxide, aluminum nitride, or silicon nitride as a main component, for example.

The metal plates 22*a* and 22*b* are made of a metal with high thermal conductivity as a main component. Examples of the metal here include copper, aluminum, and an alloy containing at least one of these. Plating may be performed on the surfaces of the metal plates to improve their corrosion resistance. Examples of the plating material used here include nickel, a nickel-phosphorus alloy, and a nickel-boron alloy.

The wiring boards 23*a*1 to 23*a*5 and 23*b*1 to 23*b*5 are made of a metal with high electrical conductivity as a main component. Examples of the metal here include copper, aluminum, and an alloy containing at least one of these. Plating may be performed on the surfaces of the wiring boards 23*a*1 to 23*a*5 and 23*b*1 to 23*b*5 to improve their corrosion resistance. Examples of the plating material used here include nickel, a nickel-phosphorus alloy, and a nickel-boron alloy.

For example, the above wiring boards 23*a*1 to 23*a*5 and 23*b*1 to 23*b*5 are obtained by forming a metal layer on each front surface of the insulating plates 21*a* and 21*b* and performing etching on the metal layer. Alternatively, the wiring boards 23*a*1 to 23*a*5 and 23*b*1 to 23*b*5 cut out of a metal layer in advance may be press-bonded to the front surfaces of the insulating plates 21*a* and 21*b*. In this connection, the shapes and quantity of the wiring boards 23*a*1 to 23*a*5 and 23*b*1 to 23*b*5 are illustrated in FIGS. 2 to 4 as an example.

As the insulated circuit substrates 20*a* and 20*b* configured as above, direct copper bonding (DCB) substrates and active metal brazed (AMB) substrates may be used, for example. The insulated circuit substrates 20*a* and 20*b* are able to conduct heat generated by the semiconductor chips 41*a* to 44*a* and 41*b* to 44*b* through the wiring boards 23*a*2 and 23*b*2, insulating plates 21*a* and 21*b*, and metal plates 22*a* and 22*b* to the outside.

In addition, the inner end portion (first leg portion 71*a* (see FIG. 2)) of the first wiring member 71 is connected to the wiring boards 23*a*3 and 23*a*5 of the insulated circuit substrate 20*a* via the bonding material 43 (not illustrated). The inner end portion (second leg portion 72*a* (see FIG. 2)) of the second wiring member 72 is connected to the wiring boards 23*b*2 of the insulated circuit substrate 20*b* via the bonding material 43 (not illustrated). The inner end portion (third leg portion 74*a* (see FIG. 2)) of the third wiring member 74 is connected to the wiring boards 23*a*2 of the insulated circuit substrate 20*a* via the bonding material 43 (not illustrated). The bonding material 43 may be solder or sintered metal. Lead-containing solder or lead-free solder may be used as the solder. For example, the lead-free solder contains, as a main component, at least any one of a tin-silver copper alloy, a tin-zinc-bismuth alloy, a tin-copper alloy, and a tin-silver-indium-bismuth alloy. In addition, the solder may contain an additive. Examples of the additive include nickel, germanium, cobalt, antimony, and silicon. The solder containing the additive exhibits improved wettability, gloss, and bonding strength, which results in improving the reliability. The side of the bonding material 43 widens in the direction toward the wiring boards 23*a*3 and 23*a*5 (that is, a fillet shape). The sintered metal contains copper, silver, or a silver alloy as a main component. In this connection, rectangles depicted in the wiring boards 23*a*2, 23*a*3, 23*a*5, 23*b*2 represent the bonding areas of the third, first, and second wiring members 74, 71, and 72. In addition, for example, ultrasonic bonding may be performed for the bonding, instead of using the solder.

The semiconductor chips 41*a* to 44*a* and 41*b* to 44*b* are made of silicon as a main component. The semiconductor chips 41*a*, 42*a*, 41*b*, and 42*b* are switching elements. A switching element is an IGBT or a power MOSFET, for example. Such semiconductor chips 41*a*, 42*a*, 41*b*, and 42*b* each have a drain electrode or collector electrode serving as an input electrode (main electrode) on the rear surface thereof. In addition, the semiconductor chips 41*a*, 42*a*, 41*b*, and 42*b* each have a control electrode 41*a*1, 42*a*1, 41*b*1, or 42*b*1 (gate electrode) and a source electrode or emitter electrode serving as an output electrode (main electrode) on the front surface thereof. The rear surfaces of these semiconductor chips 41*a*, 42*a*, 41*b*, and 42*b* are bonded to the wiring boards 23*a*2 and 23*b*2 using the above-described bonding material 43 (not illustrated). In addition, the bonding material 43 is solder or sintered metal, as described earlier.

The semiconductor chips 43*a*, 44*a*, 43*b*, and 44*b* are diode elements. The diode elements are free wheeling diodes (FWDs). For example, such a diode element includes a Schottky barrier diode (SBD) or a PN junction diode. Such semiconductor chips 43*a*, 44*a*, 43*b*, and 44*b* each have a cathode electrode serving as an output electrode (main electrode) on the rear surface thereof, and an anode electrode serving as an input electrode (main electrode) on the front surface thereof. The rear surfaces of these semiconductor chips 43*a*, 44*a*, 43*b*, and 44*b* are bonded to the wiring boards 23*a*2 and 23*b*3 using solder (not illustrated).

In this connection, each semiconductor chip 41*a* to 44*a* and 41*b* to 44*b* may be a reverse-conducting (RC)-IGBT element. An RC-IGBT element is formed by integrating a switching element and a diode element into one semiconductor chip. Alternatively, in place of the semiconductor chips 41*a* to 44*a* and 41*b* to 44*b*, semiconductor chips that are power MOSFETs made of silicon carbide as a main component may be used. Such a semiconductor chip includes FWD together with power MOSFET.

The above-described insulated circuit substrates 20*a* and 20*b* and semiconductor chips 41*a* to 44*a* and 41*b* to 44*b* are wired using the following bonding wires 51*a* to 55*a*, 51*b* to 56*b*, and 57 to 59.

The bonding wires 51*a* and 52*a* for control wires are electrically connected to the wiring board 23*a*1 and the control electrodes 41*a*1 and 42*a*1 of the semiconductor chips 41*a* and 42*a*. The bonding wires 53*a* and 54*a* are electrically connected to the wiring boards 23*a*3 and 23*a*5, the main electrodes of the semiconductor chips 41*a* and 42*a*, and the main electrodes of the semiconductor chips 43*a* and 44*a*.

The bonding wires 51*b* and 52*b* for control wires are electrically connected to the wiring board 23*b*1 and the control electrodes 41*b*1 and 42*b*1 of the semiconductor chips 41*b* and 42*b*. The bonding wires 53*b* and 54*b* are electrically connected to the wiring boards 23*b*5 and 23*b*3, the main electrodes of the semiconductor chips 41*b* and 42*b*, and the main electrodes of the semiconductor chips 43*b* and 44*b*. The bonding wires 55*b* and 56*b* are electrically connected to the wiring board 23*b*4, the main electrodes of the semiconductor chips 41*b* and 42*b*, and the main electrodes of the semiconductor chips 43*b* and 44*b*.

In addition, the bonding wires 57 and 58 are electrically connected to the wiring board 23*a*2 of the insulated circuit substrate 20*a* and the wiring boards 23*b*3 and 23*b*5 of the insulated circuit substrate 20*b*. The bonding wires 59 is electrically connected to the wiring board 23*a*4 of the insulated circuit substrate 20*a* and the wiring board 23*b*4 of the insulated circuit substrate 20*b*.

In this connection, the bonding wires 51*a* to 55*a*, 51*b* to 56*b*, and 57 to 59 are made of a metal with high electrical conductivity, such as aluminum or copper, or an alloy containing at least one of these.

As illustrated in FIGS. 2 and 3, the wiring unit 70 includes the above first and second wiring members 71 and 72 and the wiring holding unit 73 covering and holding the first and second wiring members 71 and 72. The first and second wiring members 71 and 72 are plate-like lead frames. The wiring holding unit 73 is made of a resin with insulation, for example, a thermoplastic resin. Examples of the resin here include a polyphenylene sulfide resin, a polybutylene terephthalate resin, a polybutylene succinate resin, a polyamide resin, and an acrylonitrile butadiene styrene resin. In addition, an insulating ceramic filler may be added to such a resin. Examples of the ceramic filler here include oxide, nitride, and carbide. Specific examples include silicon, aluminum, and boron.

The first wiring member 71 includes the first leg portion 71*a*, a first vertical portion 71*b*, and the first external connection portion 71*d*. The lower end portion of the first leg portion 71*a* of the first wiring member 71 is bonded to the wiring boards 23*a*3 and 23*a*5 of the insulated circuit substrate 20*a*. The first vertical portion 71*b* is connected to the upper end portion of the first leg portion 71*a* and extends vertically upward (in the +Z direction). The first external connection portion 71*d* is connected to the first vertical portion 71*b*, extends to the outside from the lid 61, and is bent toward the front surface of the lid 61. The wiring boards 23*a*3 and 23*a*5 are wire-bonded to the main electrodes on the front surfaces of the semiconductor chips 41*a*, 42*a*, 43*a*, and 44*a* using the bonding wires 53*a* and 54*a*. Therefore, the first wiring member 71 is electrically connected to the main electrodes on the front surfaces of the semiconductor chips 41*a*, 42*a*, 43*a*, and 44*a*, so that a main current flows therethrough.

In addition, the second wiring member 72 includes a second leg portion 72*a*, a second vertical portion 72*b*, a second horizontal portion 72*c*, and the second external connection portion 72*d*. The lower end portion of the second leg portion 72*a* of the second wiring member 72 is bonded to the wiring board 23*b*2 of the insulated circuit substrate 20*b*. The second vertical portion 72*b* is connected to the upper end portion of the second leg portion 72*a* and extends vertically upward (in the +Z direction). The second horizontal portion 72*c* extends from the second vertical portion 72*b* in the +X direction. The second external connection portion 72*d* is connected to the second horizontal portion 72*c*, extends to the outside from the lid 61, and is bent toward the front surface of the lid 61. The wiring board 23*b*2 is electrically connected to the main electrodes on the rear surfaces of the semiconductor chips 41*b*, 42*b*, 43*b*, and 44*b*. Therefore, the second wiring member 72 is electrically connected to the main electrodes on the rear surfaces of the semiconductor chips 41*b*, 42*b*, 43*b*, and 44*b*, so that a main current flows therethrough.

In addition, the third wiring member 74 is a plate-like lead frame. The third wiring member 74 includes a third leg portion 74*a*, a third horizontal portion 74*c*, and the third external connection portion 74*d*. The lower end portion of the third leg portion 74*a* of the third wiring member 74 is bonded to the wiring board 23*a*2 of the insulated circuit substrate 20*a*. The third horizontal portion 74*c* is connected to the upper end portion of the third leg portion 74*a* and extends in the +X direction. The third external connection portion 74*d* is connected to the third horizontal portion 74*c*, extends to the outside from the lid 61, and is bent toward the front surface of the lid 61. The wiring board 23*a*2 is electrically connected to the main electrodes on the rear surfaces of the semiconductor chips 41*a* to 44*a*. Therefore, the third wiring member 74 is electrically connected to the main electrodes on the rear surfaces of the semiconductor chips 41*a* to 44*a*, so that a main current flows therethrough.

In this connection, the control terminals 75 and 76 are electrically connected to the wiring boards 23a1 and 23b1, respectively, although the detailed illustration is omitted. A control signal input from the outside is input to the control electrodes 41a1, 42a1, 41b1, and 42b1 of the semiconductor chips 41a, 42a, 41b, and 42b via the control terminals 75 and 76, wiring boards 23a1 and 23b1, and bonding wires 51a, 52a, 51b, and 52b.

The first to third wiring members 71, 72, and 74 and control terminals 75 and 76 are made of a metal with high electrical conductivity as a main component. Examples of the metal here include aluminum, copper, iron, nickel, and an alloy containing at least one of these. Plating may be performed on the surfaces of the first to third wiring members 71, 72, and 74 to improve their corrosion resistance. Examples of the plating material used here include nickel, a nickel-phosphorus alloy, and a nickel-boron alloy. In addition, for the bonding between the first to third wiring members 71, 72, and 74 and the wiring boards 23a3, 23a5, 23b2, and 23a2, solder or sintered metal may be used, as in the case of bonding the semiconductor chips 41a to 44a and 41b to 44b. Alternatively, the first to third wiring members 71, 72, and 74 may be bonded directly to the wiring boards 23a3, 23a5, 23b2, and 23a2 with ultrasonic vibration.

The heat dissipation base 30 has a plate shape and is rectangular in plan view. The heat dissipation base 30 has a long side 30a, a short side 30b, a long side 30c, and a short side 30d on the four sides of the front surface 32a and rear surface 32b. A substrate region 32a1 where the insulated circuit substrates 20a and 20b are disposed is set at the center of the front surface 32a of the heat dissipation base 30. In plan view, fastening holes 31a to 31d that extend from the front surface 32a to the rear surface 32b of the heat dissipation base 30 are formed in order at the respective corners with the substrate region 32a1 located therebetween in the heat dissipation base 30. For example, the fastening holes 31a and 31c have the substrate region 32a1 therebetween on the diagonal line.

This heat dissipation base 30 is made of a metal with high thermal conductivity as a main component. Examples of the metal here include copper, aluminum, and an alloy containing at least one of these. Plating may be performed on the surface of the heat dissipation base 30 to improve its corrosion resistance. Examples of the plating material used here include nickel, a nickel-phosphorus alloy, and a nickel-boron alloy.

A cooling unit (not illustrated) may be attached to the rear surface of the heat dissipation base 30. For example, the cooling unit here is made of a metal with high thermal conductivity. Examples of the metal here include aluminum, iron, silver, copper, and an alloy containing at least one of these. In addition, the cooling unit is a heat sink with one or more fins, a water-cooling jacket, or another. In addition, such a cooling unit may be integrally formed with the heat dissipation base 30.

Figure 5:
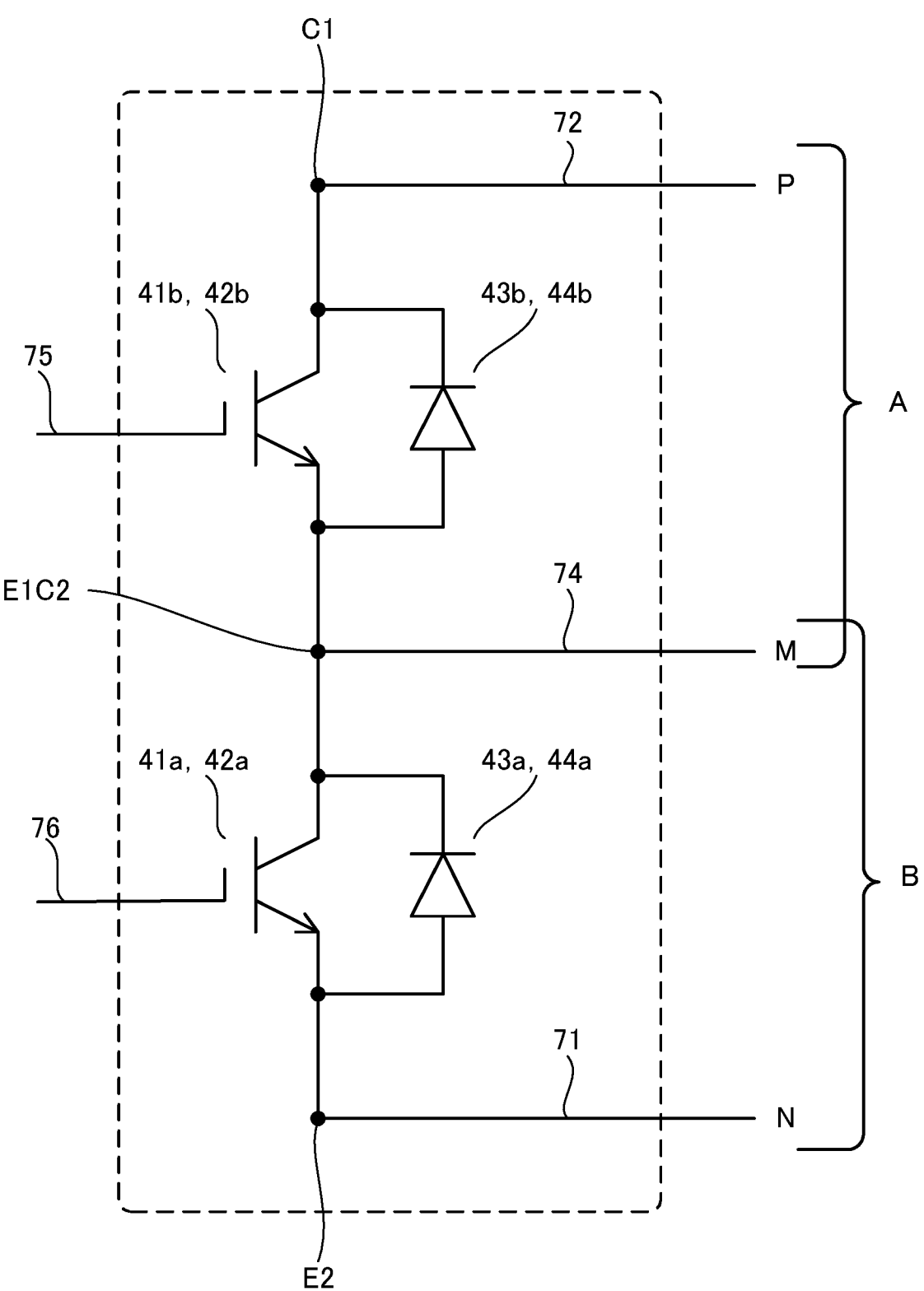
FIG. 5 is an equivalent circuit diagram representing functions of the semiconductor device according to the embodiment.

The following describes an equivalent circuit representing functions of the semiconductor device 10 with reference to FIG. 5. FIG. 5 is an equivalent circuit diagram representing functions of the semiconductor device according to the embodiment. As illustrated in FIG. 5, the semiconductor device 10 has a half-bridge circuit with an upper arm part A and a lower arm part B. The upper arm part A of the semiconductor device 10 includes the insulated circuit substrate 20b, the bonding wires 51b to 56b provided on the insulated circuit substrate 20b, the semiconductor chips 41b to 44b, and the second wiring member 72. The upper arm part A also includes the bonding wires 57 to 59, the wiring board 23a2 of the insulated circuit substrate 20a, and the third wiring member 74 disposed on the wiring board 23a2.

The lower arm part B of the semiconductor device 10 includes the insulated circuit substrate 20a, the bonding wires 51a to 56a provided on the insulated circuit substrate 20a, the semiconductor chips 41a to 44a, and the first wiring member 71. The lower arm part B also includes the third wiring member 74. In addition, the two insulated circuit substrates 20a and 20b are connected with the bonding wires 57 to 59. With this configuration, the upper arm part A and the lower arm part B are connected to each other. Thus, the semiconductor device 10 functions as a half-bridge circuit with the upper arm part A and the lower arm part B.

In this semiconductor device 10, a wire connecting a connection point P connected to the positive electrode of a power supply (not illustrated) and a connection point C1 connected to the input electrodes of the semiconductor chips 41b and 42b corresponds to the second wiring member 72. That is, the second wiring member 72 is a P terminal forming a positive-electrode input terminal in the half-bridge circuit. A wire connecting a connection point M connected to the terminal of a load and a connection point E1C2 connected to the output electrodes of the semiconductor chips 41b and 42b and the input electrodes of the semiconductor chips 41a and 42a corresponds to the third wiring member 74. That is, the third wiring member 74 is an M terminal forming an output terminal in the half-bridge circuit. A wire connecting a connection point N connected to the negative electrode of the power supply (not illustrated) and a connection point E2 connected to the output electrodes of the semiconductor chips 41a and 42a corresponds to the first wiring member 71. That is, the first wiring member 71 is an N terminal forming a negative-electrode input terminal in the half-bridge circuit.

Figure 6:
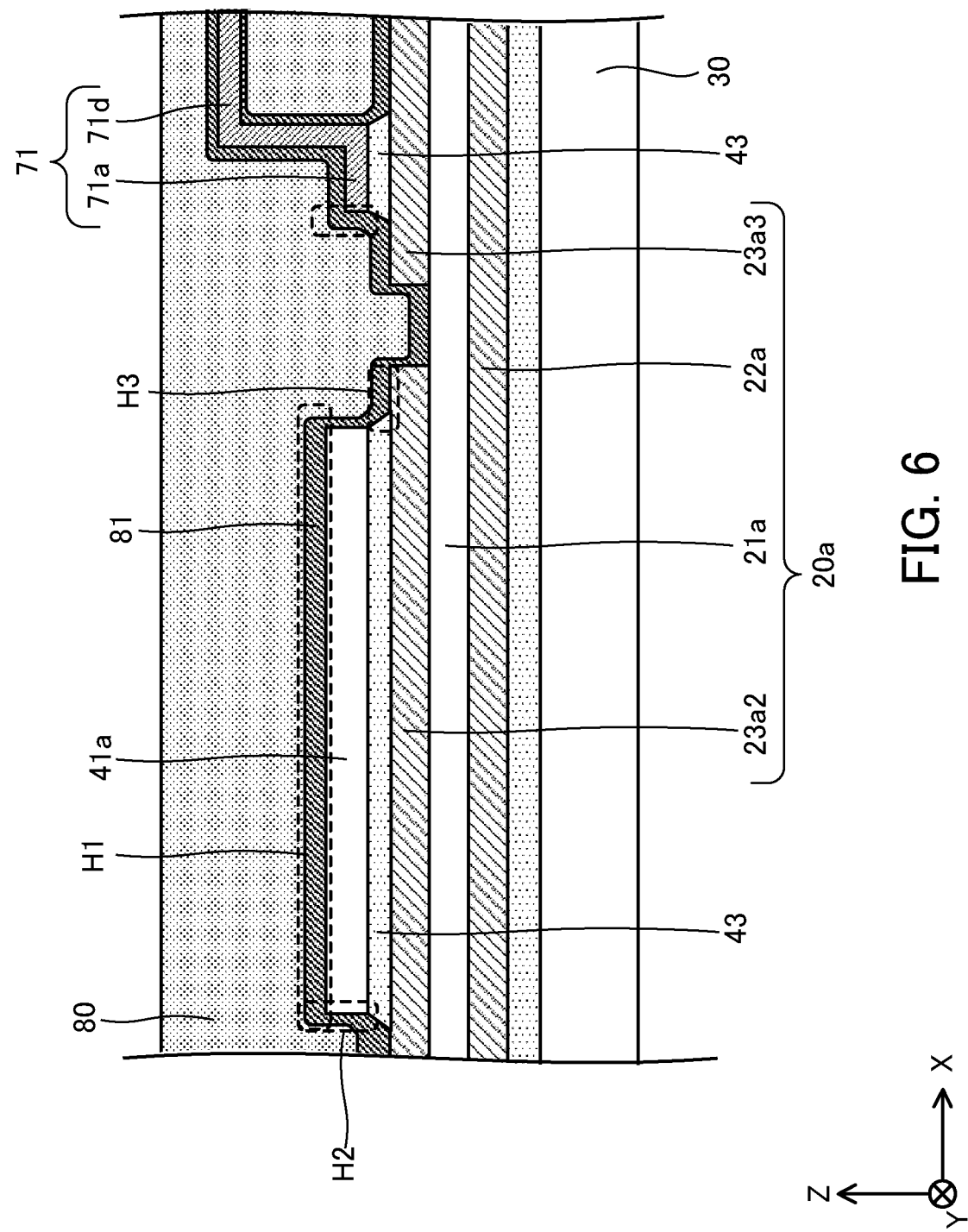
FIG. 6 is a sectional view of a main part of the semiconductor device according to the embodiment.

The following describes a part enclosed by a broken line of FIG. 2 in detail with reference to FIG. 6. FIG. 6 is a sectional view of a main part of the semiconductor device according to the embodiment. In this connection, FIG. 6 is an enlarged view illustrating the semiconductor chip 41a, the first leg portion 71a of the first wiring member 71, and their surroundings. In this connection, the following merely describes the semiconductor chip 41a and the first leg portion 71a of the first wiring member 71 as an example. The same applies to components other than the semiconductor chip 41a and the first leg portion 71a of the first wiring member 71, which are exposed inside the case 60 in plan view.

As described earlier, the sealing member 80 seals the inside of the case 60 via an adhesive layer 81. That is, the adhesive layer 81 is applied to the entire surface of the components exposed inside the case 60 in plan view, before the sealing member 80 is applied. The adhesive layer 81 is made of a thermoplastic resin as a main component, for example. The thermoplastic resin here is able to form a film at a processing temperature lower than or equal to a predetermined temperature (for example, 180° or higher but 210° or lower). Such a thermoplastic resin exhibits high thermal resistance, high chemical resistance, and high stress relaxation. For example, this thermoplastic resin contains a polyimide resin, a polyamide resin, or a polyamide-imide resin as a main component.

For example, the entire surface of the components exposed includes the front surface 32a of the heat dissipation base 30 except for the areas of the insulated circuit substrates 20a and 20b, the front surfaces and sides of the wiring boards 23a1 to 23a5 and 23b1 to 23b5 except for the areas of the semiconductor chips 41a to 44a and 41b to 44b of the insulated circuit substrates 20a and 20b, and the front surfaces of the insulating plates 21a and 21b exposed in the gap between the wiring boards 23a1 to 23a5 and 23b1 to 23b5. The entire surface also includes the front surfaces and sides of the semiconductor chips 41a to 44a and 41b to 44b and the sides of the bonding material 43 bonding the semiconductor chips 41a to 44a and 41b to 44b. In addition, the entire surface includes the front surfaces and sides of the first to third leg portions 71a, 72a, and 74a and the side of the bonding material 43 bonding the first to third leg portions 71a, 72a, and 74a. The entire surface further includes the surfaces of the bonding wires 51a to 55a, 51b to 56b, 57, 58, and 59 in their entirety.

For example, referring to FIG. 6, the adhesive layer 81 is applied to the front surface of the wiring board 23a2 of the insulated circuit substrate 20a, the side of the bonding material 43, the front surface and side of the semiconductor chip 41a, and the front surface of the insulating plate 21a. In addition, the adhesive layer 81 is applied to the front surface of the wiring board 23a3, the front surface and side of the first wiring member 71, and the side of the bonding material 43. In addition, not illustrated, the adhesive layer 81 may be applied to the lower portions of the inner surfaces of the sidewalls 62a to 62d of the case 60 close to the heat dissipation base 30. The sealing member 80 is applied over the adhesive layer 81.

The thickness of an area of the adhesive layer 81, applied as above, approximately parallel to the front surface of the heat dissipation base 30 is greater than that of an area of the adhesive layer 81 approximately perpendicular to the front surface of the heat dissipation base 30. In the case of FIG. 6, the thickness of an area of the adhesive layer 81 approximately parallel to the front surface of the heat dissipation base 30 is a thickness H1 of the adhesive layer 81 formed on the front surface of the semiconductor chip 41a. The thickness H1 is s height measured in the direction orthogonal to the front surface of the semiconductor chip 41a. That is, this thickness H1 is a thickness measured in the direction parallel to the lamination direction (±Z directions) in which the semiconductor chips 41a to 44a and 41b to 44b are laminated on the insulated circuit substrates 20a and 20b.

In addition, the thickness (H3) of the adhesive layer 81 formed on the front surface of each of the wiring boards 23a2 and 23a3 and insulating plate 21a is a height measured in the direction (lamination direction) orthogonal to the front surface of each of the wiring board 23a2 and 23a3 and insulating plate 21a. The thickness H1 is approximately equal to the thickness H3 and is, for example, in the range of 5 μm to 20 μm, inclusive.

In addition, in the case of FIG. 6, the thickness of an area of the adhesive layer 81 approximately perpendicular to the front surface of the heat dissipation base 30 is the thickness H2 of the adhesive layer 81 formed on the side (side surface) of the semiconductor chip 41a. The thickness H2 is a height measured in the direction (the direction orthogonal to lamination direction) orthogonal to the side of the semiconductor chip 41a. That is, the thickness direction of the thickness H2 is orthogonal to the thickness direction of the thickness H1 (and thickness H3). For example, the thickness H2 is in the range of 5 μm to 15 μm, inclusive.

In addition, the adhesive layer 81 is also applied to cover the side of the bonding material 43 bonding the semiconductor chip 41a and the first leg portion 71a of the first wiring member 71 to the wiring boards 23a2 and 23a3. The thickness of the adhesive layer 81 on the side of the bonding material 43 is approximately equal to the thickness H2.

In this connection, the adhesive layer 81 applied to the front surface and side of each of the first to third leg portions 71a, 72a, and 74a may have thicknesses H1 and H2, respectively. In addition, the adhesive layer 81 may also be applied to the rear surfaces of the first and second leg portions 71a and 72a.

Figure 7:
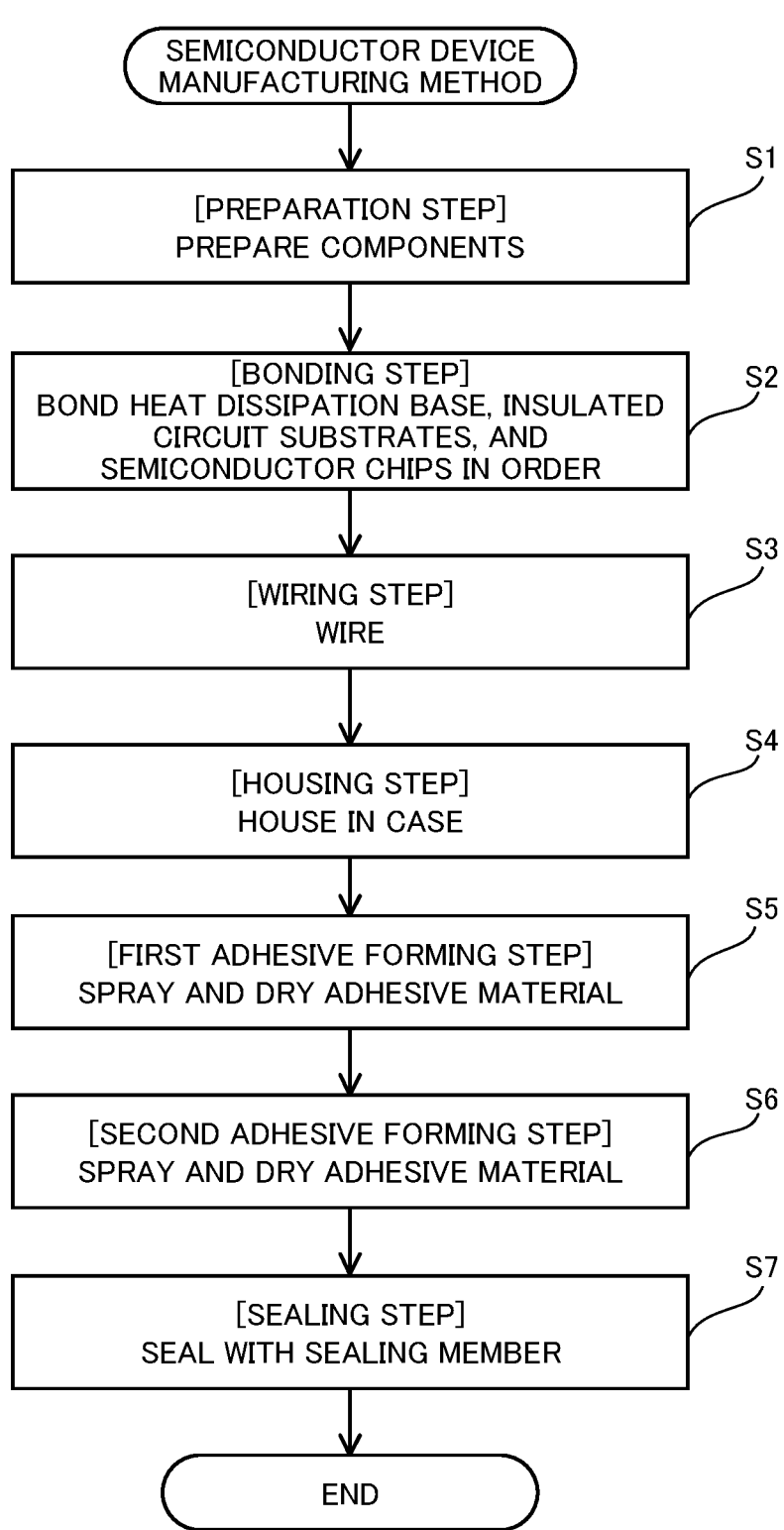
FIG. 7 is a flowchart illustrating a semiconductor device manufacturing method according to the embodiment.
Figure 8:
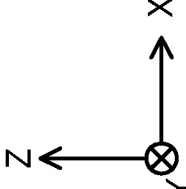
FIG. 8 is a view for describing a first adhesive application step included in the semiconductor device manufacturing method according to the embodiment.
Figure 9:
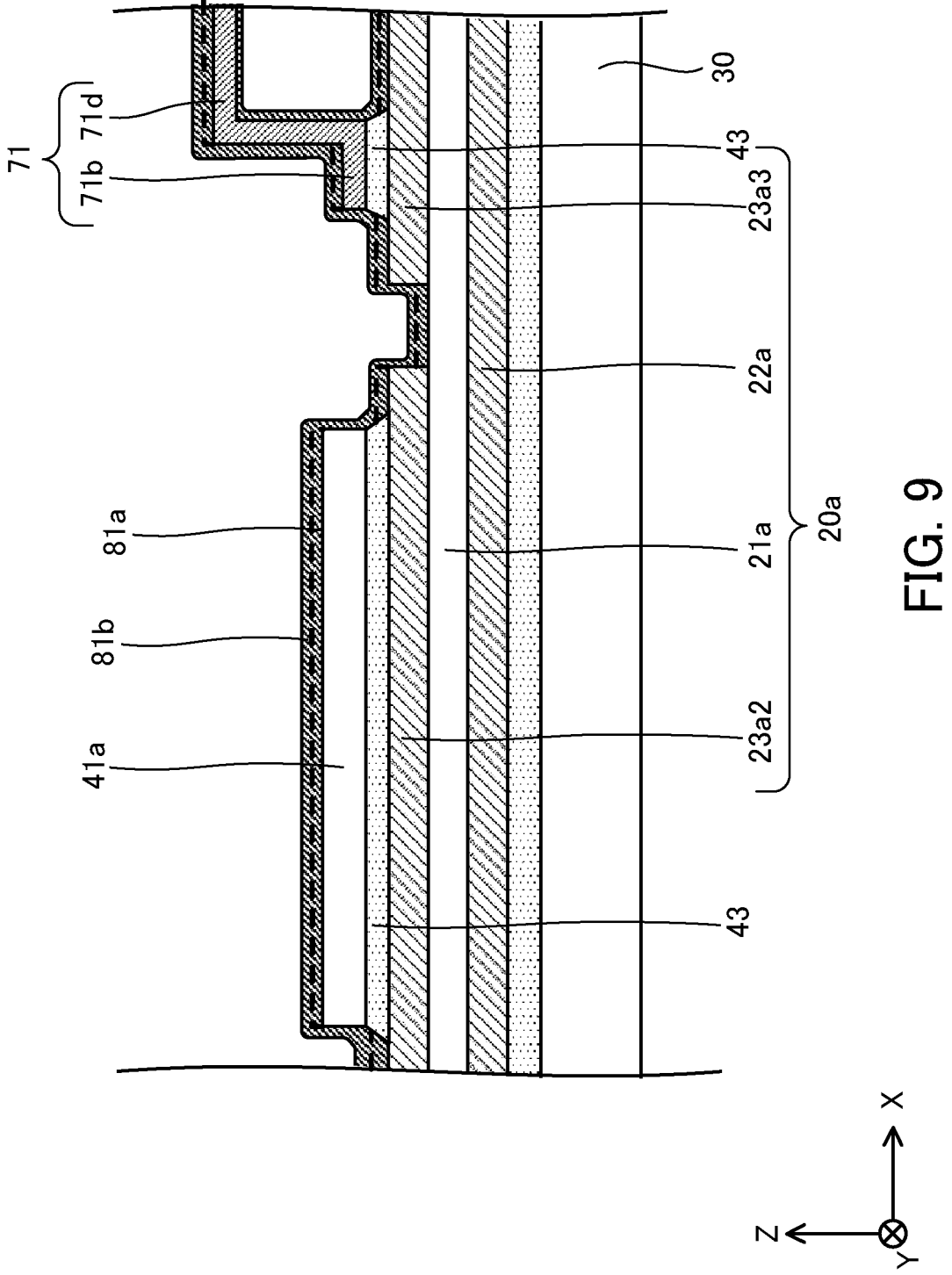
FIG. 9 is a view for describing a second adhesive application step included in the semiconductor device manufacturing method according to the embodiment.

The following describes a method of manufacturing the semiconductor device 10 with reference to FIGS. 7 to 9. FIG. 7 is a flowchart illustrating a semiconductor device manufacturing method according to the embodiment. FIG. 8 is a view for describing a first adhesive application step included in the semiconductor device manufacturing method according to the embodiment. FIG. 9 is a view for describing a second adhesive application step included in the semiconductor device manufacturing method according to the embodiment. In this connection, FIGS. 8 and 9 correspond to the sectional view of FIG. 6.

First, a preparation step of preparing components of the semiconductor device 10 is performed (step S1). For example, the components include the semiconductor chips 41a to 44a and 41b to 44b, insulated circuit substrates 20a and 20b, heat dissipation base 30, wiring unit 70, third wiring member 74, case 60, and heat dissipation base 30. In addition to these components, other components needed for manufacturing the semiconductor device 10 and manufacturing equipment are prepared.

Then, a bonding step is performed (step S2). The insulated circuit substrates 20a and 20b are disposed in the substrate region 32a1 on the front surface 32a of the heat dissipation base 30 via a solder plate. The semiconductor chips 41a to 44a and 41b to 44b are disposed on the wiring board 23a2 of the insulated circuit substrate 20a and the wiring board 23b2 of the insulated circuit substrate 20b via the solder plate. Then, by curing the bonding material 43 that is molten solder made by heating the solder plate, the heat dissipation base 30, insulated circuit substrates 20a and 20b, and semiconductor chips 41a to 44a and 41b to 44b are bonded in order by the bonding material 43.

Then, a wiring step is performed (step S3). The wiring is performed using the bonding wires 51a to 55a, 51b to 56b, 57, 58, and 59, as illustrated in FIG. 4. The wiring unit 70 and third wiring member 74 are bonded at predetermined positions on the insulated circuit substrates 20a and 20b. The first leg portion 71a of the first wiring member 71 included in the wiring unit 70 is bonded to the wiring boards 23a3 and 23a5 of the insulated circuit substrate 20a using the bonding material 43. The second leg portion 72a of the second wiring member 72 of the wiring unit 70 is bonded to the wiring board 23b2 of the insulated circuit substrate 20b using the bonding material 43. In addition, the third leg portion 74a of the third wiring member 74 is bonded to the wiring board 23a2 of the insulated circuit substrate 20a using the bonding material 43.

After that, a housing step of housing these components in the case 60 is performed (step S4). The lower end portions of the sidewalls 62a to 62d of the case 60 are attached to the outer periphery of the heat dissipation base 30 using an adhesive. By doing so, the insulated circuit substrates 20a and 20b and semiconductor chips 41a to 44a and 41b to 44b wired as above are housed in the case 60.

Then, a first adhesive forming step for forming an adhesive layer is performed (step S5). After step S4, an adhesive material is sprayed all over the insulated circuit substrates 20a and 20b, semiconductor chips 41a to 44a and 41b to 44b, and wiring members on the heat dissipation base 30 inside the case 60. In this connection, the wiring members include the bonding wires 51*a* to 55*a*, 51*b* to 56*b*, 57, 58, and 59, wiring unit 70, and third wiring member 74.

The sprayed adhesive material is dried, thereby applying the adhesive film 81*a* only on the front surfaces of the wiring boards 23*a*1 to 23*a*5 and 23*b*1 to 23*b*5, insulating plates 21*a* and 21*b*, semiconductor chips 41*a* to 44*a* and 41*b* to 44*b*, and first to third wiring members 71, 72, and 74 on the insulated circuit substrates 20*a* and 20*b*. In this connection, since the adhesive material is sprayed, the adhesive material adheres to the wiring boards 23*a*2 to 23*a*4 and 23*b*2, and 23*b*4 hidden by the first to third wiring members 71, 72, and 74 in plan view.

When the adhesive material is sprayed, for example, the adhesive material adheres to the side and front surface of the semiconductor chip 41*a*. However, the adhesive material adhering to the sides of the semiconductor chips 41*a* to 44*a* and 41*b* to 44*b*, insulating plates 21*a* and 21*b*, bonding material 43, and first to third wiring members 71, 72, and 74 flows down in the −Y direction.

For this reason, for example, the adhesive material adheres to the front surfaces of the wiring boards 23*a*2 and 23*a*3, the front surface of the semiconductor chip 41*a*, and the front surface of the first wiring member 71, thereby forming the adhesive film 81*a*, as illustrated in FIG. 8. On the other hand, since the adhesive material adhering to the sides of the semiconductor chip 41*a*, bonding material 43, and first wiring member 71 flows down, the adhesive film 81*a* is not formed on the sides of them.

Then, a second adhesive forming step for forming the adhesive layer is performed (step S6). After step S5, an adhesive material is sprayed all over the insulated circuit substrates 20*a* and 20*b*, semiconductor chips 41*a* to 44*a* and 41*b* to 44*b*, and wiring members on the heat dissipation base 30 having the adhesive film 81*a* formed on the front surface thereof inside the case 60, and is then dried.

By doing so, an adhesive film 81*b* is additionally formed on the adhesive film 81*a* formed on the front surfaces of the wiring boards 23*a*1 to 23*a*5 and 23*b*1 to 23*b*5, insulating plates 21*a* and 21*b*, semiconductor chips 41*a* to 44*a* and 41*b* to 44*b*, and first to third wiring members 71, 72, and 74 on the insulated circuit substrates 20*a* and 20*b*, as in step S5.

In addition, in this case, for example, the adhesive material adhering to the side in the +X direction of the semiconductor chip 41*a* and the side of the bonding material 43 stays between the edge of the adhesive film 81*a* on the front surface of the semiconductor chip 41*a* and the edge of the adhesive film 81*a* on the front surface of the wiring board 23*a*2 and is prevented from flowing down. Therefore, as illustrated in FIG. 9, the adhesive film 81*b* is formed on the side of each of the semiconductor chip 41*a*, bonding material 43, wiring boards 23*a*2 and 23*a*3, and first wiring member 71.

Thus formed adhesive film 81*b* is laminated on the adhesive film 81*a*, so that the adhesive layer 81 is formed all over the semiconductor chips 41*a* to 44*a* and 41*b* to 44*b*, insulating plates 21*a* and 21*b*, bonding material 43, and first to third wiring members 71, 72, and 74 in plan view. Thus formed adhesive layer 81 exhibits high adhesion to the heat dissipation base 30, the insulated circuit substrates 20*a* and 20*b* (wiring boards 23*a*1 to 23*a*5 and 23*b*1 to 23*b*5 and insulating plates 21*a* and 21*b*), semiconductor chips 41*a* to 44*a* and 41*b* to 44*b*, and wiring members.

After that, a sealing step of sealing with the sealing member 80 is performed (step S7). After the adhesive layer 81 is formed, the sealing member 80 is applied on the adhesive layer 81 entirely covering the inside of the case 60 up to fill the inside of the case 60.

Here, if no adhesive layer 81 is formed, the sealing member 80 directly seals the heat dissipation base 30, insulated circuit substrates 20*a* and 20*b* (wiring boards 23*a*1 to 23*a*5 and 23*b*1 to 23*b*5 and insulating plates 21*a* and 21*b*), semiconductor chips 41*a* to 44*a* and 41*b* to 44*b*, and wiring members. However, the sealing member 80 exhibits low adhesion to them. Therefore, if the semiconductor device 10 without the adhesive layer 81 operates and generates heat, the sealing member 80 separates from these components due to a difference in linear expansion coefficient. If the separation extends, the insulation of the sealing member 80 is not maintained, and thus the semiconductor device 10 may malfunction.

In addition, regarding the above-mentioned semiconductor chips that may be used in place of the semiconductor chips 41*a* to 44*a* and 41*b* to 44*b*, it is hard to form an oxide film on the front surfaces of semiconductor chips that are power MOSFETS made of silicon carbide as a main component, compared with semiconductor chips made of silicon as a main component. Therefore, the semiconductor chips made of silicon carbide as a main component exhibit lower adhesion to the sealing member 80.

The sealing member 80 exhibits high adhesion to the adhesive layer 81. Therefore, before the case 60 is sealed with the sealing member 80, the adhesive layer 81 is formed inside the case 60. In the case where the inside of the case 60 is sealed with the sealing member 80 via the adhesive layer 81, the occurrence and extension of separation of the sealing member 80 are prevented, which in turn prevents a reduction in the reliability of the semiconductor device 10.

After the sealing is performed in this way, the lid 61 is attached to the opening of the case 60 using an adhesive. At this time, the lid 61 exposes the first to third external connection portions 71*d*, 72*d*, and 74*d* of the first to third wiring members 71, 72, and 74, which are then bent. By doing so, the semiconductor device 10 is obtained.

The above-described semiconductor device 10 includes the semiconductor chips 41*a* to 44*a* and 41*b* to 44*b* having main electrodes on the front surfaces thereof, the wiring boards 23*a*2 and 23*b*2 to which the rear surfaces of the semiconductor chips 41*a* to 44*a* and 41*b* to 44*b* are bonded, and the sealing member 80 applied to the front surfaces of the wiring boards 23*a*2 and 23*b*2 to seal the front surfaces of the wiring boards 23*a*2 and 23*b*2 and the semiconductor chips 41*a* to 44*a* and 41*b* to 44*b*. In addition, the adhesive layer 81 that is a laminate of at least two adhesive films 81*a* and 81*b* is provided on the surfaces of the wiring boards 23*a*2 and 23*b*2 and semiconductor chips 41*a* to 44*a* and 41*b* to 44*b* so as to face the sealing member 80. By doing so, the sealing member 80 is able to reliably seal the semiconductor chips 41*a* to 44*a* and 41*b* to 44*b* and wiring boards 23*a*2 and 23*b*2 via the adhesive layer 81, so as to prevent an occurrence and extension of separation. As a result, it is possible to prevent a reduction in the reliability of the semiconductor device 10.

The disclosed technique makes it possible to prevent a decrease in the adhesion of a sealing member and to thereby prevent separation of the sealing member, which results in preventing a reduction in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor chip having a main electrode on a front surface thereof;
a wiring board having a front surface to which a rear surface of the semiconductor chip is bonded;
a sealing member sealing the wiring board and the semiconductor chip; and
an adhesive layer including at least first and second adhesive films that are laminated to each other, the adhesive layer being provided on surfaces of the wiring board and the semiconductor chip so that the sealing member seals the wiring board and the semiconductor chip via the adhesive layer, wherein
the second adhesive film is disposed on the first adhesive film such that the second adhesive film is not in direct contact with the front surface of the semiconductor chip.

2. The semiconductor device according to claim 1, wherein a first thickness of the adhesive layer measured in a first direction orthogonal to the front surface of the semiconductor chip is greater than or equal to a second thickness of the adhesive layer measured in a second direction orthogonal to a side surface of the semiconductor chip.

3. The semiconductor device according to claim 2, wherein the first thickness of the adhesive layer is approximately equal to a third thickness of the adhesive layer on the front surface of the wiring board outside an area where the semiconductor chip is bonded, the third thickness being measured in a third direction orthogonal to the front surface of the wiring board.

4. The semiconductor device according to claim 3, wherein
the semiconductor chip is bonded to the front surface of the wiring board using a bonding material,
the adhesive layer further covers a side of the bonding material so that the sealing member seals the side of the bonding material via the adhesive layer, and
the second thickness of the adhesive layer is approximately equal to a thickness of a portion of the adhesive layer that covers the side of the bonding material.

5. The semiconductor device according to claim 4, wherein the side of the bonding material widens in a direction from the semiconductor chip toward the wiring board.

6. The semiconductor device according to claim 2, wherein the second thickness is greater than or equal to 5 µm.

7. The semiconductor device according to claim 1, wherein the semiconductor chip is made of silicon carbide as a main component.

8. The semiconductor device according to claim 1, wherein the adhesive layer contains a polyamide resin, a polyimide resin, or a polyamide-imide resin as a main component.

9. The semiconductor device according to claim 1, wherein the sealing member is made of a thermosetting resin as a main component.

10. A semiconductor device, comprising:
a semiconductor chip having a main electrode on a front surface thereof;
a wiring board having a front surface to which a rear surface of the semiconductor chip is bonded;
a sealing member sealing the wiring board and the semiconductor chip;
an adhesive layer including at least two adhesive films that are laminated to each other, the adhesive layer being provided on surfaces of the wiring board and the semiconductor chip so that the sealing member seals the wiring board and the semiconductor chip via the adhesive layer; and
a case housing the semiconductor chip and the wiring board, the adhesive layer being provided on the semiconductor chip and the wiring board, the sealing member sealing an inside of the case,
wherein the adhesive layer further covers at least a portion of an inner surface of the case.

11. A semiconductor device manufacturing method, comprising:
preparing a wiring board and a semiconductor chip;
bonding the semiconductor chip to the wiring board;
forming a plurality of adhesive films that are laminated to each other to cover a front surface of the wiring board and a surface of the semiconductor chip to thereby form an adhesive layer; and
applying a sealing member all over the adhesive layer for sealing, wherein
the forming of the adhesive layer includes repeating, a plural number of times, a process of applying an adhesive material on the front surface of the wiring board and the surface of the semiconductor chip and drying the adhesive material to form one of the plurality of adhesive films.

12. The semiconductor device manufacturing method according to claim 11, wherein the forming of the adhesive layer includes applying a first adhesive material on the front surface of the wiring board and the surface of the semiconductor chip and drying the first adhesive material to form a first adhesive film, and applying a second adhesive material on the first adhesive film so as to form a second adhesive film that is in direct contact with the first adhesive film and not in direct contact with the front surface of the semiconductor chip.

* * * * *